United States Patent [19]

Bayruns et al.

[11] Patent Number: 5,493,718
[45] Date of Patent: Feb. 20, 1996

[54] DUAL-CHANNEL LOW CURRENT LOW NOISE BLOCK DOWNCONVERTER

[75] Inventors: Robert J. Bayruns, Middlesex; Philip W. Wallace, Bernardsville; Thomas D. DeNigris, Livingston, all of N.J.

[73] Assignee: Anadigics, Inc., Warren, N.J.

[21] Appl. No.: 112,778

[22] Filed: Aug. 26, 1993

[51] Int. Cl.6 ................................................. H04B 1/26
[52] U.S. Cl. .............................................. 455/323; 455/330
[58] Field of Search .................................. 455/207, 208, 455/303, 311, 314, 315, 323, 318, 319, 325, 326, 330, 333, 343; 307/529, 355

[56] References Cited

U.S. PATENT DOCUMENTS

| | | | |
|---|---|---|---|
| 3,699,451 | 10/1972 | Ohaski | 325/368 |
| 4,032,849 | 6/1977 | Gysel et al. | 455/325 |
| 4,051,474 | 9/1977 | Mack et al. | 343/100 LE |
| 4,195,262 | 3/1980 | King | 455/67 |
| 4,293,945 | 10/1981 | Atia et al. | 370/17 |
| 4,320,533 | 3/1982 | Hashima | 455/259 |
| 4,606,054 | 8/1986 | Amitay et al. | 375/102 |
| 4,901,368 | 2/1990 | Arnold et al. | 455/12 |
| 4,996,718 | 2/1991 | Shiomi | 455/326 |
| 5,027,430 | 6/1991 | Yamauchi et al. | 455/188 |
| 5,046,135 | 9/1991 | Hatcher | 455/303 |
| 5,068,668 | 11/1991 | Tsuda et al. | 342/362 |

*Primary Examiner*—Reinhard J. Eisenzopf
*Assistant Examiner*—Thanh Le
*Attorney, Agent, or Firm*—Pennie & Edmonds

[57] ABSTRACT

An electrical circuit forming a dual-channel low current Low Noise Block (LNB) downconverter comprising two downconverting circuits electrically connected in series with each other and each electrically connected in parallel with a Zener diode such that power consumption is minimized and component life improved.

29 Claims, 2 Drawing Sheets

DUAL-CHANNEL LOW CURRENT LOW NOISE BLOCK DOWNCONVERTER

FIELD OF THE INVENTION

The present invention relates generally to satellite broadcast technology and more specifically, it relates to an electrical circuit for converting satellite signals obtained by a receiving device from a higher frequency to a lower frequency.

BACKGROUND OF THE INVENTION

In general, satellite transmission technology uses an orbiting satellite to transmit an electromagnetic signal of very high frequency for reception by earth based antennas. Once received by the antennas, the high frequency signal is converted into a lower frequency signal so that it may be more easily manipulated by additional circuitry and/or transmitted through cables over ground. The device used to convert the transmitted signals from a higher frequency to a lower frequency is normally a Low Noise Block downconverter (LNB) and it is this device that has been improved in accordance with the invention.

In satellite transmissions of television signals, each television channel normally occupies a finite bandwidth of approximately 30 Mhz in the frequency spectrum. In order to reduce the interference between two adjacent channels, the signals for any two adjacent channels are polarized into opposite directions. For example, if the two signals are circularly polarized, one would have a polarization having clockwise direction, whereas the other one would have a counter clockwise direction; if the two signals are linearly polarized, one would have a vertical and the other a horizontal polarization. Thus, for a given number of channels, the channels having even numbers have the same polarization whereas the channels having odd numbers have the same but opposite polarization as the even channels.

A typical satellite receiver utilizes a single LNB downconverter to receive the signal from an antenna. Additionally, the receiver includes a switch for selecting a particular polarization; it cannot receive two oppositely polarized signals at once. The switch is normally placed at the receiving antenna or in the downconverter. Thus the receiver is capable of receiving signals with their polarizations.

The above-described satellite receiver, which utilizes a single LNB downconverter, has the disadvantage that it can only receive signals having the polarization at a time; it cannot be used in applications where signals having opposite polarizations are to be downconverted simultaneously. For example, in a household having two TV sets and one satellite antenna, using such a receiver would result in the two television sets being limited to play the channels whose signals having the same polarization; as a result, if one TV set is tuned to an even number channel, the other TV set is required to play only the even number channels.

A solution to this problem is to utilize two LNB downconverters, each being individually connected to a power supply and each having its own polarization switch but receiving signals from the same antenna. Since each LNB downconverter works independently of the other, two distinct transmission signals may be downconverted simultaneously through the two LNB downconverters. Consequently, if two television sets were employed at the same time, each could receive its own separate channel.

One considerable disadvantage of using a two-downconverter system in this manner is that it uses substantially more power than the single downconverter system. In a satellite receiver, because of constraints from other devices in the receiver, the dc power supply normally supplies a dc voltage that is more than twice the voltage required for a single downconverter. Thus, the voltage must be decreased through a regulator so that only the required voltage is applied to each downconverter.

For example, if the power supply provides dc voltage of 14V, and the downconverters are designed such that they only require 6V, then the dc voltage must be adjusted through a voltage regulator so that only 6V is applied to each downconverter. The voltage regulator is connected to the downconverter in series; a serially connected downconverter and voltage regulator are attached to the voltage supply. In such a configuration, each downconverter draws its own current from the power supply, so that the power consumption for two would be twice what is consumed using a single downconverter.

The high power consumption of the two downconverter system increases the burden of the dc power supply. Additionally, the high current drawn by the two downconverters (in the order of 200 mA) increases the thermal strain on the electronic components in the dc power supply as well as the LNBs, and undermines their life expectancy.

Accordingly, a central object of the present invention is to provide a downconverter that is capable of simultaneously processing two oppositely polarized television signals but with low power consumption; and A further object of the invention is to increase the life span of the dc power supply and the LNBs in the satellite receiver.

SUMMARY OF THE INVENTION

In a first embodiment of the present invention, a dual-channel downconverter for receiving two high frequency signals and converting the signals into two corresponding signals having lower frequencies comprises a dc electric power supply having high and low potential terminals for providing between its terminals a predetermined output voltage, $V_{DD}$, the low potential terminal being connected to a ground potential, and first and second downconverting circuit means, each of which is capable of receiving and converting an ac signal into a corresponding ac signal having a lower frequency.

Each downconverting circuit means has first and second dc terminals. The two downconverting circuit means are connected in series with each other and with the power supply, with the first dc terminal of the first downconverting circuit means being connected to the high potential terminal of the power supply, the second dc terminal of the first downconverting circuit means being connected to the first dc terminal of the second downconverting circuit means, and the second dc terminal of the second downconverting circuit means being connected to the low potential terminal of the power supply. Additionally, each downconverting circuit means has dc voltage requirements between its dc terminals no greater than one half of $V_{DD}$.

The dual-channel further comprises a microwave grounding means which is connected between the second terminal of the first downconverting circuit means and the ground potential for providing a microwave ground at the second terminal of the first downconverting means.

The dual-channel downconverter further comprises two diodes means, each electrically connected in parallel to each downconverting circuit means. In addition, the polarity of each diode means is arranged such that it is reverse biased.

The two diode means have substantially the same reverse bias characteristics, where each diode means becomes substantially conductive when the reverse voltage applied to it substantially reaches a predetermined value, $V_Z$, causing a current to flow through the diode means and thereby substantially limiting the reverse bias voltage on the diode means as well as the voltage between the dc terminals of the downconverting circuit means connected in parallel thereto to the predetermined value, $V_Z$, and thereby providing sufficient dc voltage between the dc terminals of the other downconverting circuit means.

Preferably, in the first embodiment the first downconverting circuit means further includes a first Radio Frequency (RF) input port, a first Intermediate Frequency (IF) output port, and a first Local Oscillator (LO) port which is resistively connected to the second terminal of said first downconverting means through a first resistive means.

Additionally, the second downconverting circuit means further includes a second Radio Frequency (RF) input port, a second Intermediate Frequency (IF) output port, and a second Local Oscillator (LO) port which is resistively connected to the second terminal of said second downconverting means through a second resistive means. Furthermore, the microwave grounding means comprises a capacitive means.

In a second embodiment of the invention, a dual-channel downconverter for receiving two high frequency signals and converting the signals into two corresponding signals having lower frequencies comprises a first dc power supply, a second dc power supply, a microwave grounding means, first and second downconverting circuit means, and first and second diode means.

The first dc electric power supply has high and low potential terminals with the low potential terminal connected to a ground potential, and provides between its terminals a first predetermined output voltage, $V_{D1}$.

The second dc electric power supply has high and low potential terminals, and provides between its terminals a second predetermined output voltage, $V_{D2}$.

The low potential terminal of the first power supply is connected to the high potential terminal of the second power supply.

Each of the downconverting circuit means is capable of receiving and converting an ac signal into a corresponding ac signal having a lower frequency. In addition, each of the downconverting circuit means has first, second and third dc terminals.

The first dc terminal of the first downconverting circuit means is connected to the high potential terminal of the first power supply; the second dc terminal of the first downconverting circuit means is connected to the first dc terminal of the second downconverting circuit means; and the second dc terminal of the second downconverting circuit means is connected to the low potential terminal of the first power supply.

The third dc terminal of the first downconverting circuit means is connected to the high potential terminal of the second power supply; the third dc terminal of the second downconverting circuit means is connected to the low potential terminal of the second power supply.

The low potential terminal of the first power supply is connected to the high potential terminal of the second power supply.

Each downconverting circuit has dc voltage requirements between its first and second dc terminals no greater than one half of $V_{D1}$.

The grounding means is connected between the second terminal of the first downconverting circuit means and the ground potential and it provides a microwave ground at the second terminal of the first downconverting means.

Regarding the first and second diodes, the first is electrically connected between the first and second dc terminals of the first downconverting circuit means; the second is electrically connected between the first and second dc terminals of the second downconverting circuit means. In addition, the polarity of each diode is arranged such that it is reverse biased.

The diodes have substantially the same reverse bias characteristics, where each diode means becomes substantially conductive when the reverse voltage applied to it substantially reaches a predetermined value, $V_Z$, causing a current to flow through the diode means and thereby limiting the reverse bias voltage on the diode means as well as the voltage between the first and second dc terminals of the downconverting circuit means connected in parallel with it to the predetermined value, $V_Z$, and thereby providing a sufficient dc voltage between the first and second terminals of the other downconverting circuit means.

Preferably, in the second embodiment the first downconverting circuit means further includes a first Radio Frequency (RF) input port, a first Intermediate Frequency (IF) output port, and a first Local Oscillator (LO) port which is resistively connected to the second terminal of said first downconverting means through a first resistive means.

Additionally, the second downconverting circuit means further includes a second Radio Frequency (RF) input port, a second Intermediate Frequency (IF) output port, and a second Local Oscillator (LO) port which is resistively connected to the second terminal of said second downconverting means through a second resistive means. Furthermore, the microwave grounding means comprises a capacitive means.

BRIEF DESCRIPTION OF THE DRAWINGS

These and other objects, features and advantages of the invention will be more apparent from the following detailed description in conjunction with the appended drawings in which.

DETAILED DESCRIPTION OF THE INVENTION

Figure 1A:
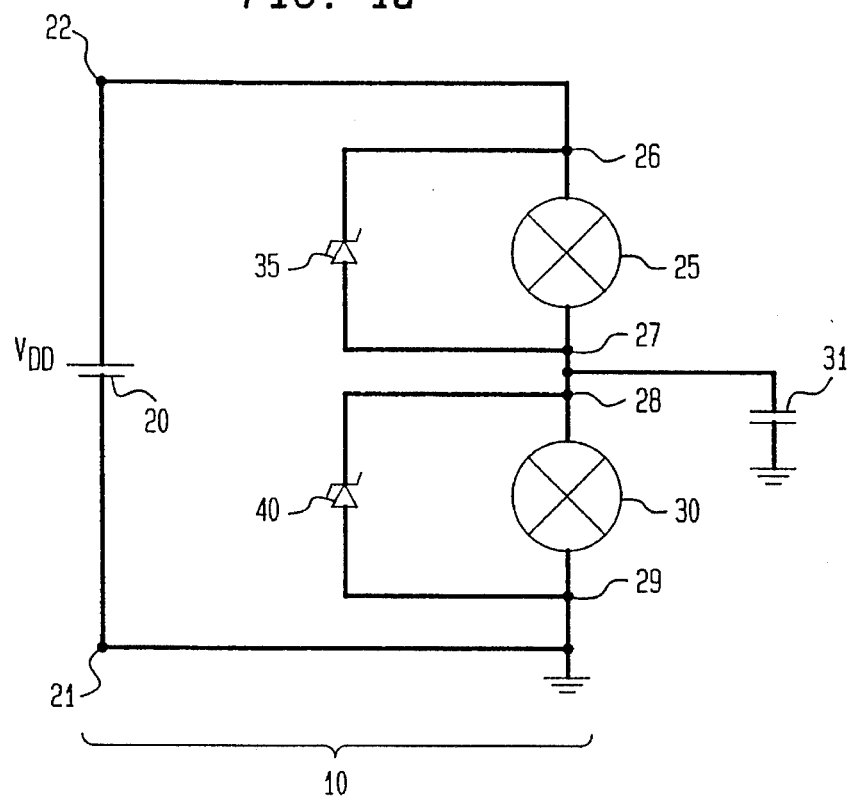
FIGS. 1a–b illustrates a first embodiment of the present invention with and without ac connections, respectively.

As illustrated in FIG. 1a which depicts a preferred first embodiment without ac connections of the invention, a dual-channel block downconverter 10 comprises a dc power supply 20 for providing a predetermined dc voltage $V_{DD}$ between a high potential terminal 22 and a low potential terminal 21, two LNB downconverters 25 and 30, a capacitor 31, and two Zener diodes 35 and 40. Low potential terminal 21 is connected to a ground potential.

Downconverter 25 has a first terminal 26 connected to high potential terminal 22 of the power supply, and a second terminal 27 connected to a first terminal 28 of downconverter 30. A second terminal 29 of downconverter 30 is connected to low potential terminal 21 of the power supply.

Each LNB downconverter is capable of receiving a high frequency signal from, for example, a cable connected to an antenna (not shown), and converting the high frequency signal into a corresponding low frequency signal; the two LNB downconverters operate independently of each other with respect to ac signals. In addition, each downconverter needs no greater than a half of $V_{DD}$ during normal operation.

Preferably, LNB downconverters 25 and 30 are the same type of circuits having the same dc power supply requirement. In addition, each LNB downconverter may be a hybrid microwave integrated circuit comprising GaAs monolithic microwave integrated circuits or Si monolithic microwave integrated circuits. Alternatively, each LNB downconverter can also be made with discrete semiconductor components, or be made with a combination of discrete semiconductor components and integrated circuits.

In this dual-channel downconverter, capacitor 31 is connected between terminal 27 and the ground potential. Because a capacitor is highly conductive to high frequency signals, capacitor 31 thus provides a microwave ground potential at terminal 27.

Zener diode 35 is connected in parallel to downconverter 25, whereas Zener diode 40 is connected in parallel to second downconverter 30.

In connecting each Zener diode, the diode's polarity is arranged such that it is reverse biased.

The Zener diodes are utilized to maintain at least a minimum dc voltage between the dc terminals of each LNB downconverter so that both LNB downconverters can properly function.

As known to those skilled in the art, a Zener diode comprises a pn junction; when it is reverse biased to substantially reach a characteristic voltage, $V_Z$, it becomes substantially conductive and draws a large current through the diode. As a result, the reverse bias voltage on the diode is substantially limited at $V_Z$. Consequently, a Zener diode can be used as a voltage limiting device. For more detailed information regarding Zener diodes, see for example, Yang, E. S., "Microelectronic Devices," McGraw-Hill, Inc., pp.84–85, 1986, which is incorporated herein by reference.

Preferably, the two Zener diodes have substantially the same reverse bias characteristics including the same characteristic voltage, $V_Z$. In addition, the characteristic voltage $V_Z$ is a value such that ($V_{DD}$-$V_Z$) is no less than a minimum voltage that is required for each LNB downconverter to operate properly.

DC Power supply 20 provides dc voltage $V_{DD}$ which is no less than twice of the voltage required to operate a single downconverting circuit. Power supply 20 may be a battery, or a circuit that converts ac power into dc power.

Should $V_{DD}$ be greater than the sum of the individual power requirements of LNB downconverters 25 and 30, a voltage regulator may be added to the circuit to ensure that the exact voltages needed by the downconverters are applied to them. Such voltage regulator is not shown in FIG. 1, but its design, purpose, and implementation should be known to those skilled in the art.

An example for the preferred embodiment is that each LNB downconverter is a GaAs LNB downconverter and each requires a single +6V dc power supply. Therefore, by providing $V_{DD}$ of 12 volts, and Zener diodes having characteristic voltage $V_Z$ no less than 6 volts such that are not conductive, each LNB downconverter has adequate dc power supply.

Note that in FIG. 1, only the dc portion of the dual-channel downconverter is illustrated, the ac connections are not shown for simplicity.

The operating principle of this dual-channel downconverter is as follows:

When the voltage between the dc terminals of each LNB downconverter is the same as the voltage between the dc terminals of the other downconverter, i.e. the dc voltage across each downconverter is about half of $V_{DD}$, each LNB is provided with sufficient dc supply for operation and the two Zener diode display high resistivity. There is minimal circuit flow through each of the Zener diode.

However, if one of the LNB downconverter such as downconverter 30 begins to draw more current, Zener diode 35 begins to turn on to conduct current so that the total current of Zener diode 35 and downconverter 25 equals to the current draw by downconverter 30, while Zener diode 40 remains turned off.

In another word, if downconverter 30 begins to draw more current, the voltage between the dc terminals of downconverter 25 is required to exceeds half of $V_{DD}$ so as to provide sufficient current to downconverter 30. Consequently, the voltage across downconverter 25 becomes more than half of $V_{DD}$. As the voltage across downconverter 25 reaches $V_Z$, Zener diode 35 turns on and holds the voltage across downconverter 25 at $V_Z$. As a result, the voltage across downconverter 30 is at ($V_{DD}$-$V_Z$), which is designed to be sufficient for its operation.

Figure 1B:
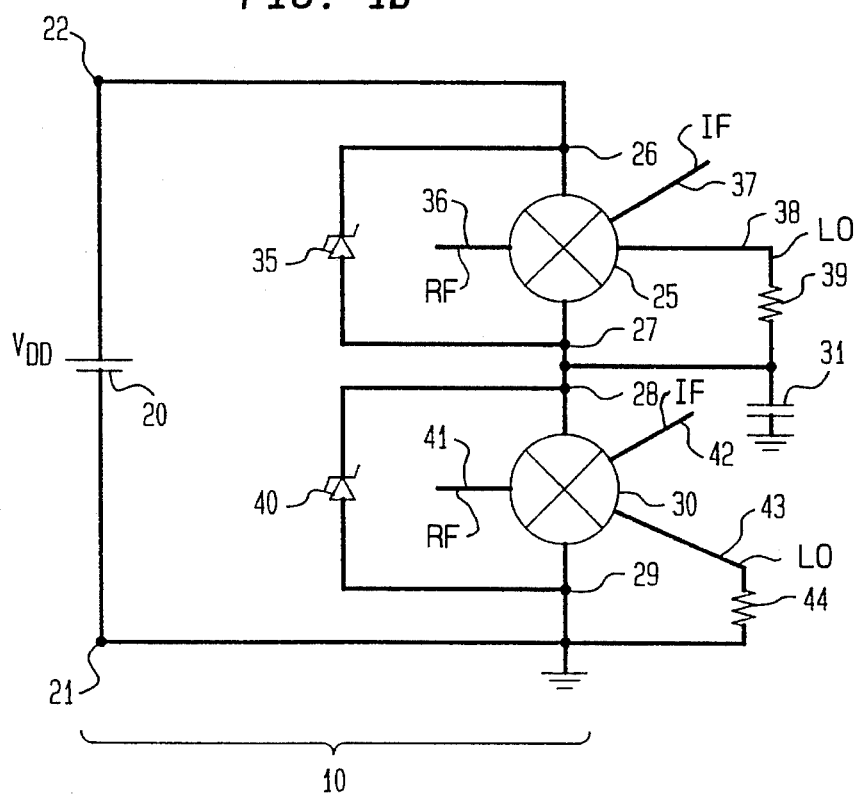

The ac connections for downconverter 10 can be configured in many possible ways, one of which is illustrated in FIG. 1b. In this configuration, LNB downconverter 25 further includes a first Radio Frequency (RF) input port 36, a first Intermediate Frequency (IF) output terminal 37, a first Local Oscillator (LO) port 38 which is coupled to terminal 27 via a first resistor 39.

Similarly, LNB downconverter 30 further includes a second Radio Frequency (RF) input port 41, a second Intermediate Frequency (IF) output terminal 42, a second Local Oscillator (LO) port 43 which is coupled to terminal 29 via a second resistor 39.

The first and second RF input ports are connected to a satellite antenna to receive two independent high frequency signals, respectively. The high frequency signals are then independently downconverted to lower frequency signals which are provided at the two IF output ports, respectively, for further processing or display.

Figure 2A:
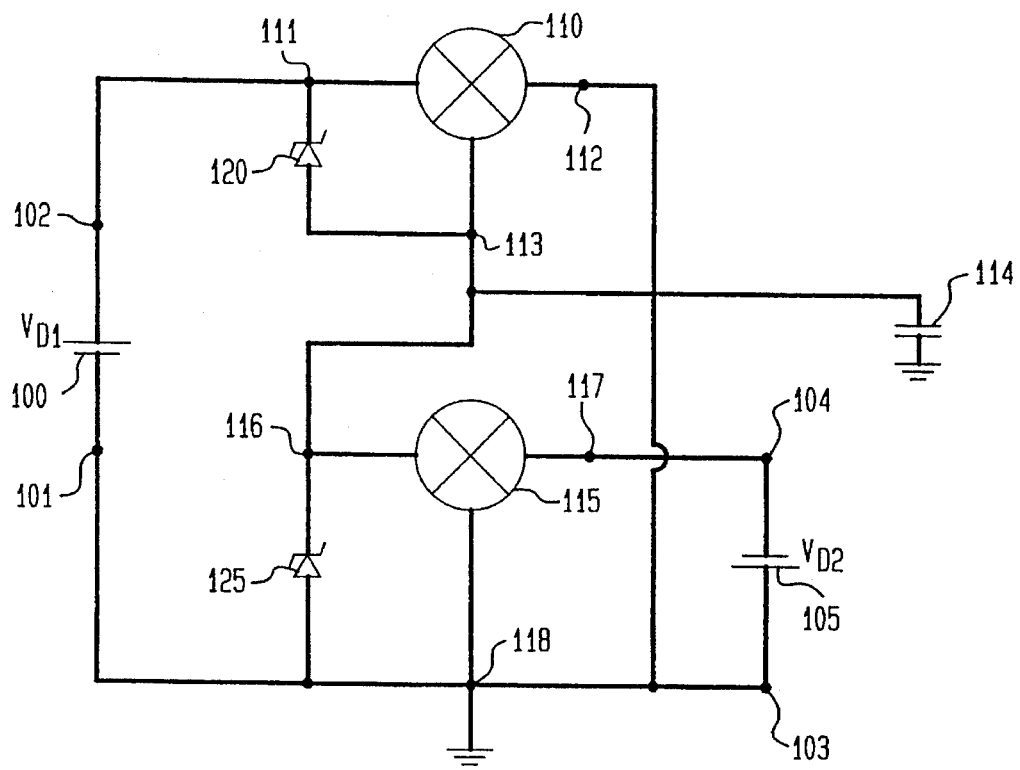
FIGS. 2a–b depicts a second embodiment of the present invention with and without ac connections, respectively.

As depicted in FIG. 2a, in a preferred second embodiment of the present invention, a dual-channel downconverter comprises a first dc power supply 100 for providing a first predetermined dc voltage, $V_{D1}$, between its high and low potential terminals 102 and 101, a second dc power supply 105 for providing a second predetermined dc voltage, $V_{D2}$, between its high and low potential terminals 103 and 104, a first LNB downconverter 110 having first, second and third dc terminals 111, 113 and 112, and a second LNB downconverter 115 having first, second and third dc terminals 116, 118 and 117.

Low potential terminals of the first dc power supply is connected to a ground potential.

The dual-channel downconverter further comprises a microwave grounding means that provides the ground potential for microwave signals at terminal 113.

The dual-channel downconverter further comprises a first Zener diode 120 connected between terminals 111 and 113, and a second Zener diode 125 connected between terminals 116 and 118.

In connecting the two Zener diodes, the polarity of each diode is arranged so that it is reverse biased.

The Zener diodes are utilized to maintain at least a minimum dc voltage required between the first and second dc terminals of each LNB downconverter so that the LNB downconverter can properly function.

Since the voltage between the first and third terminals of the first downconverter is fixed at $V_{D1}$, and the voltage between the second and third terminals of the second downconverter is fixed at $V_{D2}$, the voltages between terminals of each downconverter are thus maintained at predetermined values at which the downconverters properly function.

Preferably, the two Zener diodes have substantially the same reverse bias characteristics including the same characteristic voltage, $V_Z$. Additionally, the characteristic voltage, $V_Z$, is a value such that $(V_{D1}-V_Z)$ is no less than a minimum voltage required between the first and second terminals of each LNB downconverter for it to operate properly.

DC Power supply 20 provides dc voltage $V_{D1}$ which is no less than twice that voltage required between the first and second terminals of a single LNB downconverter. Power supplies 100 and 105 may each be a battery, or circuits that convert ac power into dc power.

Preferably, the LNB downconverters are GaAs MMIC LNB downconverters which require the first dc power supply to provide voltage, $V_{D1}$, of 12 volts, and the second dc power supply, $V_{D2}$, of 5 volts. Additionally, the characteristic reverse voltage of the Zener diodes, $V_Z$, is preferably a little over 6 volts in this embodiment. Consequently, if terminal 118 is at ground potential, the potentials of the three terminals of the first LNB downconverter with respect to the ground potential are 12, 6, and 0 volts; of the three terminals of the second LNB downconverter are 6, 0, and −5 volts. As known to those skilled in the art, those potentials are in general sufficient for the operation of GaAs LNB downconverters.

The operation principle of the second embodiment is similar to that of the aforementioned first embodiment, and thus will not be described in detail here. Generally, the Zener diodes limit the voltage between the first and second terminals of each LNB downconverter to within $V_Z$. Consequently, the voltages between the second and third terminals are also kept to within a defined value so that both LNB downconverters function properly.

Figure 2B:
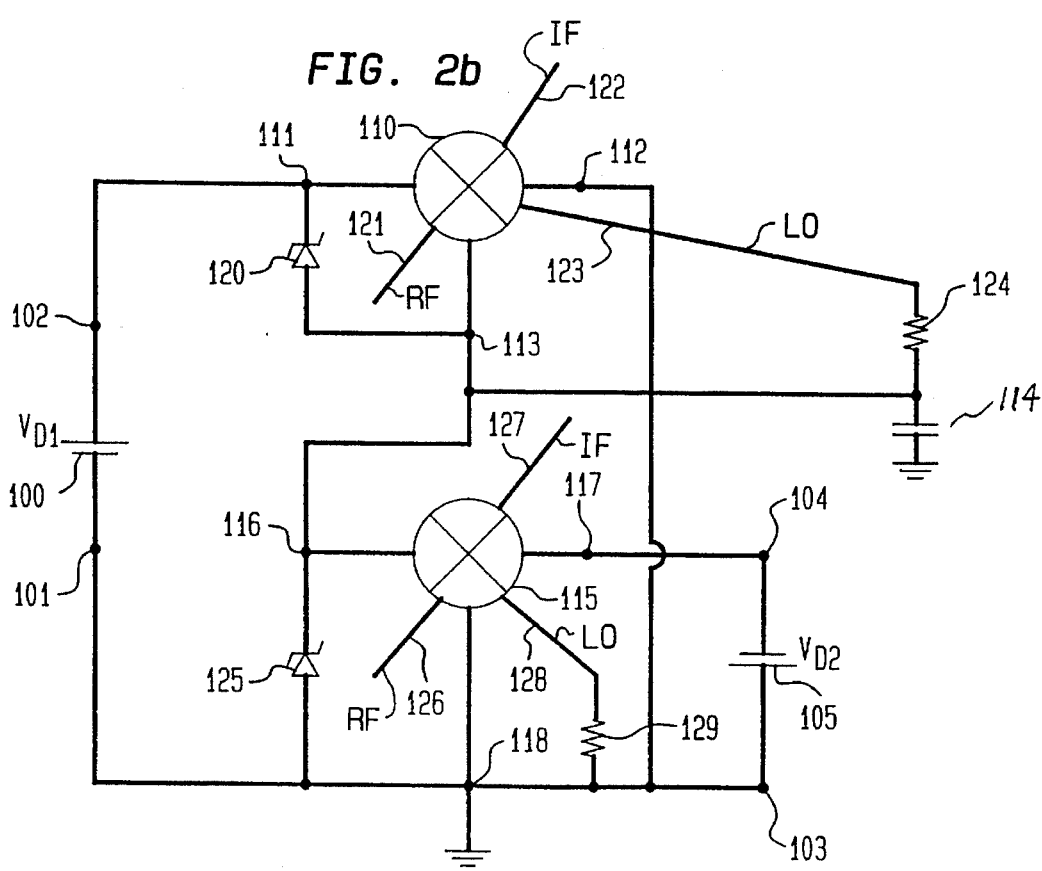

The ac connections for this dual-channel downconverter can be configured in many possible ways, one of which is illustrated in FIG. 2b. In this configuration, LNB downconverter 110 further includes a first Radio Frequency (RF) input port 121, a first Intermediate Frequency (IF) output terminal 122, a first Local Oscillator (LO) port 123 which is coupled to terminal 27 via a first resistor 124.

Similarly, LNB downconverter 115 further includes a second Radio Frequency (RF) input port 126, a second Intermediate Frequency (IF) output terminal 127, a second Local Oscillator (LO) port 128 which is coupled to terminal 118 via a second resistor 39.

The first and second RF input ports are connected to a satellite antenna to receive two independent high frequency signals, respectively. The high frequency signals are then independently downconverted to lower frequency signals which are provided at the two IF output ports, respectively, for further processing or display.

As will be apparent to those skilled in the art, numerous modifications may be made within the scope of the invention, which is not intended to be limited except in accordance with the following claims.

What is claimed is:

1. A dual-channel downconverter for receiving two high frequency signals and converting the signals into two corresponding signals having lower frequencies, comprising:

a dc electric power supply having high and low potential terminals, said power supply providing between its terminals a predetermined output voltage, $V_{DD}$, and the low pontential terminal being connected to a ground potential;

first and second downconverting circuit means, each said downconverting circuit means operating to receive and convert to ac signal into a corresponding ac signal having a lower frequency, each said downconverting circuit means having first and second dc terminals, the first dc terminal of said first downconverting circuit means being connected to the high potential terminal of said power supply, the second dc terminal of said first downconverting circuit means being connected to the first dc terminal of said second downconverting circuit means, and the second dc terminal of said second downconverting circuit means being connected to the low potential terminal of said power supply, and each said downconverting circuit means having a dc voltage requirement between its dc terminals no greater than one half of $V_{DD}$;

a microwave grounding means connected between the second terminal of said first downconverting circuit means and said ground potential for providing a microwave ground at the second terminal of said first downconverting means; and two diode means, each electrically connected in parallel to one of said first and second downconverting circuit means, the polarities of said two diode means being arranged such that both said two diode means are reverse biased, said two diode means having substantially the same reverse bias characteristics, where each of said two diode means becomes substantially conductive when the reverse voltage applied to said each diode means substantially reaches a predetermined value, $V_Z$, causing a current to flow through said each diode means and thereby substantially limiting the reverse bias voltage on said each diode means as well as the voltage between the dc terminals of the down converting circuit means connected in parallel to said each diode means to the predetermined value, $V_Z$, thereby providing a sufficient dc voltage between the dc terminals of the other downconverting circuit means.

2. The dual-channel downconverter of claim 1 wherein each said downconverting circuit means is a hybrid microwave integrated circuit.

3. The dual-channel downconverter of claim 2 wherein said hybrid microwave integrated circuit comprises GaAs monolithic microwave integrated circuits.

4. The dual-channel downconverter of claim 2 wherein said hybrid microwave integrated circuit comprises Si monolithic microwave integrated circuits.

5. The dual-channel downconverter of claim 1 wherein said first and second downconverting circuit means are substantially identical.

6. The dual-channel downconverter of claim 1 wherein said two diode means are Zener diodes having substantially the same reverse bias electrical characteristics.

7. The dual-channel downconverter of claim 1 wherein said predetermined value, $V_Z$, is a value such that $(V_{DD}-V_Z)$ is no less than a minimum voltage required between the dc terminals of each said downconverting circuit means to function properly.

8. The dual-channel downconverter of claim 1 wherein said $V_{DD}$ is approximately 12 volts.

9. The dual-channel downconverter of claim 1 wherein said $V_Z$ is no less than 6 volts.

10. The dual-channel downconverter of claim 1 wherein said first downconverting circuit means further includes a first Radio Frequency (RF) input port, a first Intermediate Frequency (IF) output port, and a first Local Oscillator (LO) port, said first LO port being resistively connected to the second terminal of said first downconverting means through a first resistive means; and wherein said second downconverting circuit means further includes a second Radio Frequency (RF) input port, a second Intermediate Frequency (IF) output port, and a second Local Oscillator (LO) port, said second LO port being resistively connected to the second terminal of said second downconverting means through a second resistive means.

11. The dual-channel downconverter of claim 1 wherein said microwave grounding means comprises a capacitive means connected between said second terminal of said first downconverting circuit means and said ground potential.

12. A dual-channel downconverter for receiving two high frequency signals and converting the signals into two corresponding signals having lower frequencies, comprising:

a dc electric power supply having high and low potential terminals, said power supply providing between its terminals a predetermined output voltage, $V_{DD}$, and said low potential terminal being connected to a ground potential;

first and second Low Noise Block (LNB) donwconverters, each said LNB donwconverter operating to receive and convert an ac signal into a corresponding ac signal having a lower frequency and each said LNB downconverter having first and second dc terminals, the first dc terminal of said first LNB downconverter being connected to the high potential terminal of said power supply, the second dc terminal of said first LNB downconverter being connected to the first dc terminal of said second LNB downconverter, and the second dc terminal of said second LNB downconverter being connected to the low potential terminal of said power supply, and each said LNB downconverter having a normal dc voltage requirement between its dc terminals no greater than one half the output voltage of said power supply, $V_{DD}$;

a microwave grounding means connected between the second terminal of said first downconverter and said ground potential for providing a microwave ground at the second terminal of said first LNB downconverter; and two Zener diodes, each electrically connected in parallel to one of said LNB downconverters, the polarities of said two Zener diodes being arranged such that both said two Zener diodes are reverse biased, said two Zener diodes having substantially the same reverse bias characteristics, where each of said two Zener diodes becomes substantially conductive when the reverse voltage applied to said each Zener diode substantially reaches a predetermined value, $V_Z$, causing a current to flow through said each Zener diode and thereby substantially limiting the reverse bias voltage applied to said each Zener diode as well as the voltage between the dc terminals of the downconverter connected in parallel to said each Zener diode to the predetermined value, $V_Z$, and providing a sufficient voltage between the dc terminals of the other LNB downconverter.

13. The dual-channel downconverter of claim 12 wherein said first LNB downconverter further includes a first Radio Frequency (RF) input port, a first Intermediate Frequency (IF) output port, and a first Local Oscillator (LO) port, said first LO port being resistively connected to the second terminal of said first LNB downconverter through a first resistive means; and wherein said second LNB downconverter further includes a second Radio Frequency (RF) input port, a second Intermediate Frequency (IF) output port, and a second Local Oscillator (LO) port, said second LO port being resistively connected to the second terminal of said second LNB downconverter through a second resistive means.

14. The dual-channel downconverter of claim 12 wherein said microwave grounding means comprises a capacitive means connected between said second terminal of said first LNB downconverter and said ground potential.

15. A dual-channel downconverter for receiving two high frequency signals and converting the signals into independent corresponding signals having lower frequencies, comprising:

a first dc electric power supply having high and low potential terminals, said first power supply providing between its terminals a first predetermined output voltage, $V_{D1}$, and the low potential terminal being connected to a ground potential;

a second dc electric power supply having high and low potential terminals, said second power supply providing between its terminals a second predetermined output voltage, $V_{D2}$, the low potential terminal of said first power supply being connected to the high potential terminal of said second power supply; and first and second downconverting circuit means, each said downconverting circuit means receiving and converting an ac signal into a corresponding ac signal having a lower frequency, each said downconverting circuit means having first, second and third dc terminals, the first dc terminal of said first downconverting circuit means being connected to the high potential terminal of said first power supply, the second dc terminal of said first downconverting circuit means being connected to the first dc terminal of said second downconverting circuit means, and the second dc terminal of said second downconverting circuit means being connected to the low potential terminal of said first power supply, the third dc terminal of said first downconverting circuit means being connected to the high potential terminal of said second power supply, the third dc terminal of said second downconverting circuit means being connected to the low potential terminal of said second power supply, each said downconverting circuit means having a dc voltage requirement between its first and second dc terminals no greater than one half the output voltage of said first power supply, $V_{D1}$;

a microwave grounding means connected between the second terminal of the first downconverting circuit means and said ground potential for providing a microwave ground at the second terminal of said first downconverting means; and first and second diode means, said first diode means being electrically connected between the first and second dc terminals of said first circuit means, said second diode means being electrically connected between the first and second dc terminals of said second circuit means, the polarities of said first and second diode means being arranged such that both said first and second diode means are reverse biased, said first and second diode means having substantially the same reverse bias characteristics, where each of said first and second diode means becoming substantially conductive when the reverse voltage applied to said each diode means substantially reaching a predetermined value, $V_Z$, drawing a current to flow through said each diode means, thereby substantially limiting the reverse bias voltage on said each diode means as well as the voltage between the first and second dc terminals of the downconverting circuit means that is connected in parallel to said each diode means to the predetermined value, $V_Z$, and thereby providing a sufficient dc voltage between the first and second terminals of the other downconverting circuit means.

16. The dual-channel downconverter of claim 15 wherein each said downconverting circuit means is a hybrid microwave integrated circuit.

17. The dual-channel downconverter of claim 16 wherein said hybrid microwave integrated circuit comprises GaAs integrated circuits.

18. The dual-channel downconverter of claim 16 wherein said hybrid microwave integrated circuit comprises Si integrated circuits.

19. The dual-channel downconverter of claim 15 wherein said first and second downconverting means are substantially identical.

20. The dual-channel downconverter of claim 15 wherein said first and second diode means are Zener diodes having substantially the same reverse bias electrical characteristics.

21. The dual-channel downconverter of claim 15 wherein the predetermined value, $V_Z$, is a value such that ($V_{D1}$-$V_Z$) is no less than a minimum voltage that is required between its first and second terminals of each said downconverting circuit means to operate properly.

22. The dual-channel downconverter of claim 15 wherein said $V_{D1}$ is approximately 12 volts.

23. The dual-channel downconverter of claim 15 wherein said $V_{D2}$ is 5 volts.

24. The dual-channel downconverter of claim 15 wherein said $V_Z$ is no less than 6 volts.

25. The dual-channel downconverter of claim 15 wherein said first downconverting circuit means further includes a first Radio Frequency (RF) input port, a first Intermediate Frequency (IF) output port, and a first Local Oscillator (LO) port, said first LO port being resistively connected to the second terminal of said first downconverting means through a first resistive means; and wherein said second downconverting circuit means further includes a second Radio Frequency (RF) input port, a second Intermediate Frequency (IF) output port, and a second Local Oscillator (LO) port, said second LO port being resistively connected to the second terminal of said second downconverting means through a second resistive means.

26. The dual-channel downconverter of claim 15 wherein said microwave grounding means comprises a capacitive means connected between said second terminal of said first downconverting circuit means and said ground potential.

27. A dual-channel Low Noise Block (LNB) downconverter for receiving two independent high frequency signals and converting the signals into two independent corresponding signals having lower frequencies, comprising:

a first dc electric power supply having first and low potential terminals, said first power supply providing between its terminals a first predetermined output voltage, $V_{D1}$, and the low potential terminal being connected to a ground potential;

a second dc electric power supply having high and low potential terminals, said second power supply providing between its terminals a second predetermined output voltage, $V_{D2}$, the low potential terminal of said first power supply being connected to the high potential terminal of said second power supply; and first and second LNB downconverters, each said LNB downconverter operating to receive and convert an ac signal into a corresponding ac signal having a lower frequency, each said LNB downconverter having first, second and third dc terminals, the first dc terminal of said first downconverter being connected to the high potential terminal of said first power supply, the second dc terminal of the said first downconverter being connected to the first dc terminal of said second downconverter, and the second dc terminal of said second downconverter being connected to the low potential terminal of said first power supply, the third dc terminal of said first downconverter being connected to the high potential terminal of said second power supply, the third dc terminal of said second downconverter being connected to the low potential terminal of said second power supply, each said LNB downconverter having dc voltage requirement between its first and second dc terminals no greater than one half of the output voltage of said first power supply, $V_{D1}$;

a microwave grounding means connected between the second terminal of the first LNB downconverter and said ground potential for providing a microwave ground at the second terminal of said first LNB downconverter; and first and second Zener diodes, said first Zener diode being electrically connected between the first and second dc terminals of said first downconverter, said second Zener diode being electrically connected between the first and second dc terminals of said second downconverter, the polarities of said first and second Zener diodes being arranged such that both said first and second Zener diodes are reverse biased, said first and second Zener diodes having substantially the same reverse bias characteristics, where each of said first and second Zener diodes becomes substantially conductive when the reverse voltage applied to said each Zener diode substantially reaches a predetermined value, $V_Z$, drawing a current to flow through said each Zener diode, thereby limiting the reverse bias voltage on said each Zener diode as well as the voltage between the first and second dc terminals of said LNB downconverter that is connected in parallel to said each Zener diode to the predetermined value, $V_Z$, and thereby providing a sufficient dc voltage between the first and second dc terminals of the other LNB downconverter.

28. The dual-channel downconverter of claim 27 wherein said first LNB downconverter further includes a first Radio Frequency (RF) input port, a first Intermediate Frequency (IF) output port, and a first Local Oscillator (LO) port, said first LO port being resistively connected to the second terminal of said first LNB downconverter through a first resistive means; and wherein said second LNB downconverter further includes a second Radio Frequency (RF) input port, a second Intermediate Frequency (IF) output port, and a second Local Oscillator (LO) port, said second LO port being resistively connected to the second terminal of said second LNB downconverter through a second resistive means.

29. The dual-channel downconverter of claim 27 wherein said microwave grounding means comprises a capacitive means connected between said second terminal of said first LNB downconverter and said ground potential.

* * * * *